(12) United States Patent
Pehlke

(10) Patent No.: US 11,700,026 B2
(45) Date of Patent: Jul. 11, 2023

(54) FEEDFORWARD POWER AMPLIFIER FOR BROADBAND OPERATION

(71) Applicant: Skyworks Solutions, Inc., Irvine, CA (US)

(72) Inventor: David Richard Pehlke, Westlake Village, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 45 days.

(21) Appl. No.: 17/455,095

(22) Filed: Nov. 16, 2021

(65) Prior Publication Data

US 2022/0224373 A1 Jul. 14, 2022

Related U.S. Application Data

(60) Provisional application No. 63/199,607, filed on Jan. 12, 2021.

(51) Int. Cl.
*H04B 1/40* (2015.01)
*H04B 1/04* (2006.01)
*H03F 3/24* (2006.01)

(52) U.S. Cl.
CPC ............ *H04B 1/40* (2013.01); *H03F 3/245* (2013.01); *H04B 1/0458* (2013.01); *H03F 2200/451* (2013.01); *H04B 2001/0441* (2013.01)

(58) Field of Classification Search
None
See application file for complete search history.

(56) References Cited

U.S. PATENT DOCUMENTS

| | | | |
|---|---|---|---|
| 4,348,642 A | 9/1982 | Harrington | |
| 4,352,072 A | 9/1982 | Harrington | |
| 5,570,063 A | 10/1996 | Eisenberg | |
| 5,644,268 A * | 7/1997 | Hang | H03F 1/3235 330/151 |
| 5,691,668 A * | 11/1997 | Yoshikawa | H03F 1/3235 330/151 |
| 5,815,036 A * | 9/1998 | Yoshikawa | H03F 1/3235 330/151 |
| 5,818,298 A | 10/1998 | Dent et al. | |
| 5,831,478 A | 11/1998 | Long | |
| 5,959,500 A | 9/1999 | Garrido | |

(Continued)

FOREIGN PATENT DOCUMENTS

CN 115053453 A * 9/2022

*Primary Examiner* — Pablo N Tran
(74) *Attorney, Agent, or Firm* — Knobbe, Martens, Olson & Bear, LLP

(57) ABSTRACT

Broadband feedforward power amplifiers are disclosed herein. In certain embodiments, a broadband feedforward power amplifier includes a power amplifier electrically connected between a radio frequency (RF) input and an RF output, and a feedforward compensation circuit including a first amplifier electrically connected in parallel with the power amplifier, a load impedance, and a second amplifier electrically connected between the radio frequency input and the load impedance. The feedforward compensation circuit generates a compensation signal based on sensing an output of the first amplifier and an output of the second amplifier, and provides the compensation signal to the radio frequency output to thereby compensate the power amplifier for non-linearity.

20 Claims, 7 Drawing Sheets

(56) References Cited

U.S. PATENT DOCUMENTS

| | | | |
|---|---|---|---|
| 6,081,156 A | 6/2000 | Choi et al. | |
| 6,242,979 B1 | 6/2001 | Li | |
| 6,255,903 B1 * | 7/2001 | Leffel | H03F 1/3235 |
| | | | 330/51 |
| 6,275,105 B1 | 8/2001 | Ghannouchi et al. | |
| 6,320,461 B1 | 11/2001 | Lee | |
| 6,333,676 B1 | 12/2001 | Neffling | |
| 6,385,436 B1 * | 5/2002 | Horiguchi | H03F 1/3223 |
| | | | 330/149 |
| 6,404,823 B1 | 6/2002 | Grange et al. | |
| 6,525,603 B1 | 2/2003 | Morgan | |
| 6,640,110 B1 | 10/2003 | Shapira et al. | |
| 6,657,490 B2 | 12/2003 | Anderson | |
| 6,734,726 B2 * | 5/2004 | Billsberry | H03F 1/32 |
| | | | 330/149 |
| 6,760,230 B2 | 7/2004 | Kooker et al. | |
| 6,794,933 B2 * | 9/2004 | Gurvich | H03F 1/3235 |
| | | | 330/151 |
| 6,937,482 B2 | 8/2005 | Kooker et al. | |
| 6,946,906 B2 | 9/2005 | Rabinovich et al. | |
| 6,958,647 B2 | 10/2005 | Rabinovich et al. | |
| 6,996,191 B1 | 2/2006 | Meditz | |
| 7,042,314 B2 | 5/2006 | Wang et al. | |
| 7,173,484 B2 | 2/2007 | Rabinovich et al. | |
| 7,940,120 B2 | 5/2011 | Grebennikov et al. | |
| 2008/0084198 A1 * | 4/2008 | Baurle | H02M 3/33507 |
| | | | 323/288 |
| 2021/0099141 A1 * | 4/2021 | Yi | H03F 1/223 |

\* cited by examiner

FEEDFORWARD POWER AMPLIFIER FOR BROADBAND OPERATION

CROSS-REFERENCE TO RELATED APPLICATIONS

This application claims the benefit of priority under 35 U.S.C. § 119 of U.S. Provisional Patent Application No. 63/199,607, filed Jan. 12, 2021 and titled "FEEDFORWARD POWER AMPLIFIER FOR BROADBAND OPERATION," which is herein incorporated by reference in its entirety.

BACKGROUND

Field

Embodiments of the invention relate to electronic systems, and in particular, to power amplifiers for radio frequency (RF) electronics.

Description of the Related Technology

Power amplifiers are used in radio frequency (RF) communication systems to amplify RF signals for transmission via antennas. It can be important to manage the power of RF signal transmissions to prolong battery life and/or provide a suitable transmit power level.

Examples of RF communication systems with one or more power amplifiers include, but are not limited to mobile phones, tablets, base stations, network access points, laptops, and wearable electronics. Power amplifiers provide amplification to RF signals, which can have a frequency in the range from about 30 kHz to 300 GHz, for instance, such as in the range of about 410 MHz to about 7.125 GHz for fifth generation (5G) communications using Frequency Range 1 (FR1) or in the range of about 24.25 GHz to 52.6 GHz for 5G communications using Frequency Range 2 (FR2).

SUMMARY

In certain embodiments, the present disclosure relates to a broadband feedforward power amplifier. The broadband feedforward power amplifier includes a power amplifier electrically connected between a radio frequency input and a radio frequency output, and a feedforward compensation circuit including a first amplifier electrically connected in parallel with the power amplifier, a load impedance, and a second amplifier electrically connected between the radio frequency input and the load impedance. The feedforward compensation circuit is configured to generate a compensation signal based on sensing an output of the first amplifier and an output of the second amplifier, and to provide the compensation signal to the radio frequency output.

In some embodiments, the first amplifier and the second amplifier are each a scaled replica of the power amplifier. According to a number of embodiments, the power amplifier, the first amplifier, and the second amplifier have matched input impedances.

In several embodiments, the output of the first amplifier is configured to provide a non-linear signal and the output of the second amplifier is configured to provide a linear signal.

In several embodiments, the feedforward compensation circuit further includes a first directional coupler configured to generate a first coupled signal based on sensing the output of the first amplifier, and a second directional coupler configured to generate a second coupled signal based on sensing the output of the second amplifier. According to a number of embodiments, the feedforward compensation circuit further includes a phase shifter configured to generate a phase shifted signal, and a combiner configured to combine the phase shifted signal and the second coupled signal. In accordance with some embodiments, the feedforward compensation circuit further includes a third amplifier configured to amplify the compensation signal to account for a coupling factor of the first directional coupler and the second directional coupler. In accordance with several embodiments, the feedforward compensation circuit further includes a third directional coupler configured to inject the compensation signal at the radio frequency output.

In some embodiments, the load impedance is a resistor.

In a number of embodiments, the load impedance is a fifty ohm load.

In various embodiments, the feedforward compensation is implemented with calibration.

In certain embodiments, the present disclosure relates to a mobile phone. The mobile phone includes a transceiver configured to generate a radio frequency transmit signal, and a front end system including a power amplifier configured to receive the radio frequency transmit signal at a radio frequency input and to provide an amplified radio frequency transmit signal at a radio frequency output, and a feedforward compensation circuit including a first amplifier electrically connected in parallel with the power amplifier, a load impedance, and a second amplifier electrically connected between the radio frequency input and the load impedance. The feedforward compensation circuit is configured to generate a compensation signal based on sensing an output of the first amplifier and an output of the second amplifier, and to provide the compensation signal to the radio frequency output.

In several embodiments, the first amplifier and the second amplifier are each a scaled replica of the power amplifier. According to a number of embodiments, the power amplifier, the first amplifier, and the second amplifier have matched input impedances.

In various embodiments, the output of the first amplifier is configured to provide a non-linear signal and the output of the second amplifier is configured to provide a linear signal.

In several embodiments, the feedforward compensation circuit further includes a first directional coupler configured to generate a first coupled signal based on sensing the output of the first amplifier, and a second directional coupler configured to generate a second coupled signal based on sensing the output of the second amplifier. In accordance with a number of embodiments, the feedforward compensation circuit further includes a phase shifter configured to generate a phase shifted signal, and a combiner configured to combine the phase shifted signal and the second coupled signal. According to some embodiments, the feedforward compensation circuit further includes a third amplifier configured to amplify the compensation signal to account for a coupling factor of the first directional coupler and the second directional coupler. In accordance with various embodiments, the feedforward compensation circuit further includes a third directional coupler configured to inject the compensation signal at the radio frequency output.

In a number of embodiments, the load impedance is a resistor.

In some embodiments, the load impedance is a fifty ohm load.

In several embodiments, the feedforward compensation is implemented with calibration.

In certain embodiments, the present disclosure relates to a method of power amplifier compensation. The method includes amplifying a radio frequency transmit signal using a power amplifier that is electrically connected between a radio frequency input and a radio frequency output, amplifying the radio frequency transmit signal using a first amplifier electrically connected in parallel with the power amplifier, amplifying the radio frequency transmit signal using a second amplifier electrically connected between the radio frequency input and a load impedance, and compensating the power amplifier for non-linearity using a compensation signal generated based on sensing an output of the first amplifier and an output of the second amplifier.

In several embodiments, the first amplifier and the second amplifier are each a scaled replica of the power amplifier. According to various embodiments, the power amplifier, the first amplifier, and the second amplifier have matched input impedances.

In a number of embodiments, the method further includes providing a non-linear signal at the output of the first amplifier and providing a linear signal at the output of the second amplifier.

In several embodiments, the method further includes generating a first coupled signal based on sensing the output of the first amplifier using a first directional coupler, and generating a second coupled signal based on sensing the output of the second amplifier using a second directional coupler. According to a number of embodiments, the method further includes generating a phase shifted signal by phase shifting the first coupled signal, and combining the phase shifted signal and the second coupled signal to generate a combined signal. In accordance with various embodiments, amplifying the compensation signal using a third amplifier to account for a coupling factor of the first directional coupler and the second directional coupler. According to some embodiments, injecting the compensation signal at the radio frequency output using a third directional coupler.

In various embodiments, the load impedance is a resistor.

In some embodiments, the load impedance is a fifty ohm load.

DETAILED DESCRIPTION OF EMBODIMENTS

Figure 1:
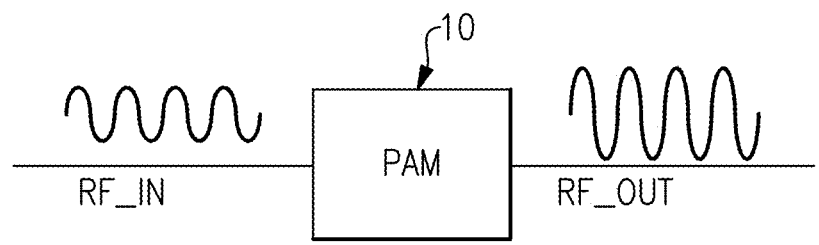
FIG. 1 is a schematic diagram of a power amplifier module for amplifying a radio frequency (RF) signal.

The headings provided herein, if any, are for convenience only and do not necessarily affect the scope or meaning of the claimed invention.

Broadband feedforward power amplifiers are disclosed herein. In certain embodiments, a broadband feedforward power amplifier includes a power amplifier electrically connected between a radio frequency (RF) input and an RF output, and a feedforward compensation circuit including a first amplifier electrically connected in parallel with the power amplifier, a load impedance, and a second amplifier electrically connected between the radio frequency input and the load impedance. The feedforward compensation circuit generates a compensation signal based on sensing an output of the first amplifier and an output of the second amplifier, and provides the compensation signal to the radio frequency output to thereby compensate the power amplifier for non-linearity.

By providing compensation in this manner, non-linear signal components generated by the power amplifier are cancelled and broadband operation is achieved. Moreover, robust performance can be realized over a wide range of process, temperature, and/or output load variations. Thus, broadband operation and high linearity is achieved in presence of varying operating conditions and/or changes in voltage standing wave ratio (VSWR).

In contrast, conventional power amplifier feedforward linearization techniques suffer from an inability to successfully cancel non-linearity over a broad frequency range of the power amplifier and/or perform less robustly in variable load impedance environments.

In certain implementations, the amplifiers of the feedforward compensation circuit are replicas (which can be scaled down in size) of the power amplifier. Additionally, input power splitting can be provided by impedance match of the amplifiers and relative impedance can be maintained over frequency by matching the input impedances (accounting for any scaling) for the amount of drive power desired. Similar scaling for the device/array sizing and the output impedance can likewise be used to provide consistent power balancing as a function of all the amplifier cores moving the same way across process and/or temperature conditions.

Absent compensation, the power amplifier suffers from non-linearity arising from load impedance variation. Since the first amplifier is connected in parallel with the power amplifier, the first amplifier is intended to undergo the same (scaled) load impedance variation across frequency as well as non-linearity and distortion, for instance, amplitude distortion (AM-AM) and/or phase distortion (AM-PM).

Although the second amplifier can be matched for impedances and gain, the second amplifier is connected to a separate load impedance (for instance, an ideal 50 Ohm load impedance) and designed for linear operation. Accordingly, the second amplifier operates with little to no signal distortion, signal clipping, and/or in-channel emissions/out-of-channel emissions.

In certain implementations, the first amplifier serves as a low power replica of the power amplifier with matched nonlinear degradations, and the second amplifier is connected to an ideal load and designed for near ideal linearity.

By sensing both the output of the first amplifier and the output of the second amplifier, the non-linearity of the power amplifier can be detected and accounted for. In certain implementations a first directional coupler is included at the output of the first amplifier and a second directional coupler is included at the output of the second amplifier to providing sensing.

In certain implementations, the feedforward compensation circuit couples the nonlinear signal from the first amplifier and the ideal linear signal from the second amplifier, and combines the coupled signal after phase shifting of the nonlinear signal to enable subtraction from the ideal signal. Additionally, the feedforward compensation signal can be implemented to generate the compensation signal by providing a subsequent linear amplification to the combined signal (with a gain selected to account for path losses and coupling factors), and to inject the compensation signal into the main signal path using an output directional coupler.

Since the distortions are in general much lower than the main path full power transmit signal through the power amplifier, the feedforward compensation circuit can operate at low current consumption. Additionally, good compensation can be achieved over a wide range of frequencies and load conditions since the feedforward compensation circuit tolerates variation in components used for phase and amplitude balancing and/or canceling.

The power amplifier compensation schemes herein are applicable to a broad range of RF electronics, including mobile phones. In contrast, certain conventional schemes include components and/or design constraints that render the compensation ill-suited for mobile phones, which are constrained by cost, form factor, and/or power consumption limitations.

FIG. 1 is a schematic diagram of a power amplifier module (PAM) 10 for amplifying an RF signal. The illustrated power amplifier module 10 amplifies an RF signal (RF_IN) to generate an amplified RF signal (RF_OUT). The power amplifier module 10 can include one or more feedforward power amplifiers implemented using one or more features of the present disclosure.

Figure 2:
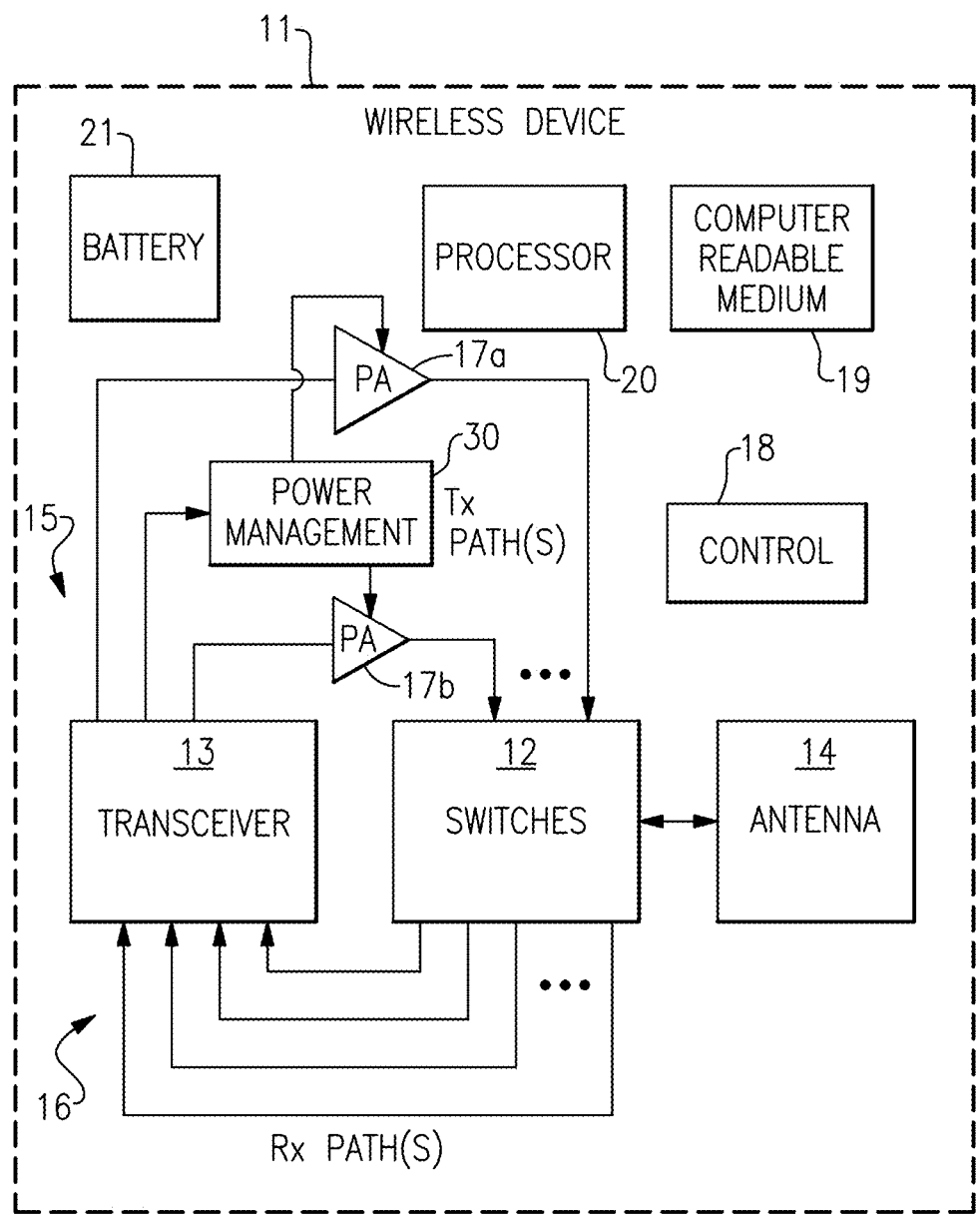
FIG. 2 is a schematic diagram of an example wireless device.

FIG. 2 is a schematic block diagram of an example wireless or mobile device 11.

The example wireless device 11 depicted in FIG. 2 can represent a multi-band and/or multi-mode device such as a multi-band/multi-mode mobile phone operating using various communication standards including, but not limited to, 2G, 3G, 4G (including, for instance, LTE, LTE-Advanced, and LTE-Advanced Pro), 5G, WLAN (for instance, Wi-Fi), WPAN (for instance, Bluetooth and ZigBee), WMAN (for instance, WiMax), and/or GPS technologies.

In certain embodiments, the wireless device 11 can include switches 12, a transceiver 13, antennas 14, power amplifiers 17a, 17b, a control component 18, a computer readable medium 19, a processor 20, a battery 21, and a power management system 30. The collection of components between the transceiver 13 and the antennas 14 can be referred to as a front-end system or RF front-end.

The transceiver 13 can generate RF signals for transmission via the antennas 14. Furthermore, the transceiver 13 can receive incoming RF signals from the antennas 14.

It will be understood that various functionalities associated with the transmission and receiving of RF signals can be achieved by one or more components that are collectively represented in FIG. 2 as the transceiver 13. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 2 as the antennas 14. For example, a single antenna can be configured to provide both transmitting and receiving functionalities. In another example, transmitting and receiving functionalities can be provided by separate antennas. In yet another example, different bands associated with the wireless device 11 can operate using different antennas.

In FIG. 2, one or more output signals from the transceiver 13 are depicted as being provided to the antennas 14 via one or more transmission paths 15 (also referred to as transmit paths 15). In the example shown, different transmission paths 15 can represent output paths associated with different bands and/or different power outputs. For instance, the two example power amplifiers 17a, 17b shown can represent amplifications associated with different power output configurations (e.g., low power output and high power output), and/or amplifications associated with different bands. Although FIG. 2 illustrates a configuration using two transmission paths 15 and two power amplifiers 17a, 17b, the wireless device 11 can be adapted to include more or fewer transmission paths 15 and/or more or fewer power amplifiers.

In FIG. 2, one or more detected signals from the antennas 14 are depicted as being provided to the transceiver 13 via one or more receiving paths 16 (also referred to as receive paths 16). In the example shown, different receiving paths 16 can represent paths associated with different bands. For example, the four example receiving paths 16 shown can represent quad-band capability that some wireless devices are provided with. Although FIG. 2 illustrates a configuration using four receiving paths 16, the wireless device 11 can be adapted to include more or fewer receiving paths 16.

To facilitate switching between receive and transmit paths, the switches 12 can be configured to electrically connect the antennas 14 to a selected transmit or receive path. Thus, the switches 12 can provide a number of switching functionalities associated with operation of the wireless device 11. In certain embodiments, the switches 12 can include a number of switches configured to provide functionalities associated with, for example, switching between different bands, switching between different power modes, switching between transmission and receiving modes, or some combination thereof. The switches 12 can also be implemented with components providing additional functionality, including filtering and/or duplexing of signals.

FIG. 2 shows that in certain embodiments, a control component 18 can be provided for controlling various control functionalities associated with operations of the switches 12, the power amplifiers 17a, 17b, the power management system 30, and/or other operating components.

In certain embodiments, a processor 20 can be configured to facilitate implementation of various processes described herein. The processor 20 can implement various computer program instructions. The processor 20 can be a general purpose computer, special purpose computer, or other programmable data processing apparatus.

In certain embodiments, these computer program instructions may also be stored in a computer-readable memory 19 that can direct the processor 20 to operate in a particular manner, such that the instructions stored in the computer-readable memory 19.

The illustrated wireless device 11 also includes the power management system 30, which can be used to provide power amplifier supply voltages to one or more of the power amplifiers 17a, 17b. For example, the power management system 30 can be configured to change the supply voltages provided to the power amplifiers 17a, 17b to improve efficiency, such as power added efficiency (PAE).

One technique for improving efficiency of a power amplifier is average power tracking (APT), in which a DC-to-DC converter or other suitable voltage regulator is used to generate a supply voltage for a power amplifier based on the power amplifier's average output power. Another technique for improving efficiency of a power amplifier is envelope tracking (ET), in which a supply voltage of the power amplifier is controlled in relation to the envelope of the RF signal. Thus, when a voltage level of the envelope of the RF signal increases the voltage level of the power amplifier's supply voltage can be increased. Likewise, when the voltage level of the envelope of the RF signal decreases the voltage level of the power amplifier's supply voltage can be decreased to reduce power consumption.

The power management system 30 can be used to provide average power tracking APT, ET, and/or other power management schemes.

Any of the power amplifiers 17a, 17b can be implemented with the feedforward compensation schemes herein. In the illustrated implementation, the power management system 30 is controlled using a power control signal generated by the transceiver 13. In certain configurations, the power control signal is provided by the transceiver 13 to the power management system 30 over an interface, such as a serial peripheral interface (SPI) or Mobile Industry Processor Interface (MIPI).

In certain configurations, the wireless device 11 may operate using carrier aggregation. Carrier aggregation can be used for both Frequency Division Duplexing (FDD) and Time Division Duplexing (TDD), and may be used to aggregate a plurality of carriers or channels, for instance up to five carriers. Carrier aggregation includes contiguous aggregation, in which contiguous carriers within the same operating frequency band are aggregated. Carrier aggregation can also be non-contiguous, and can include carriers separated in frequency within a common band or in different bands.

In certain implementations, the wireless device 11 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The wireless device 11 can also support multiple-input multiple-output (MIMO) communications and/or switched diversity communications, in certain implementations. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

In certain implementations, the wireless device 11 supports beamforming. For example, the gain and phase of RF signals propagating along the transmit paths 15 and/or the receive paths 16 can be individually controlled to provide beam formation and directivity for transmission and/or reception of signals on the antennas 14. For example, in the context of signal transmission, the gain and phases of the transmit signals are controlled such that radiated signals from the antennas 14 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 14 from a particular direction. In certain implementations, the antennas 14 include one or more arrays of antenna elements to enhance beamforming.

Figure 3:
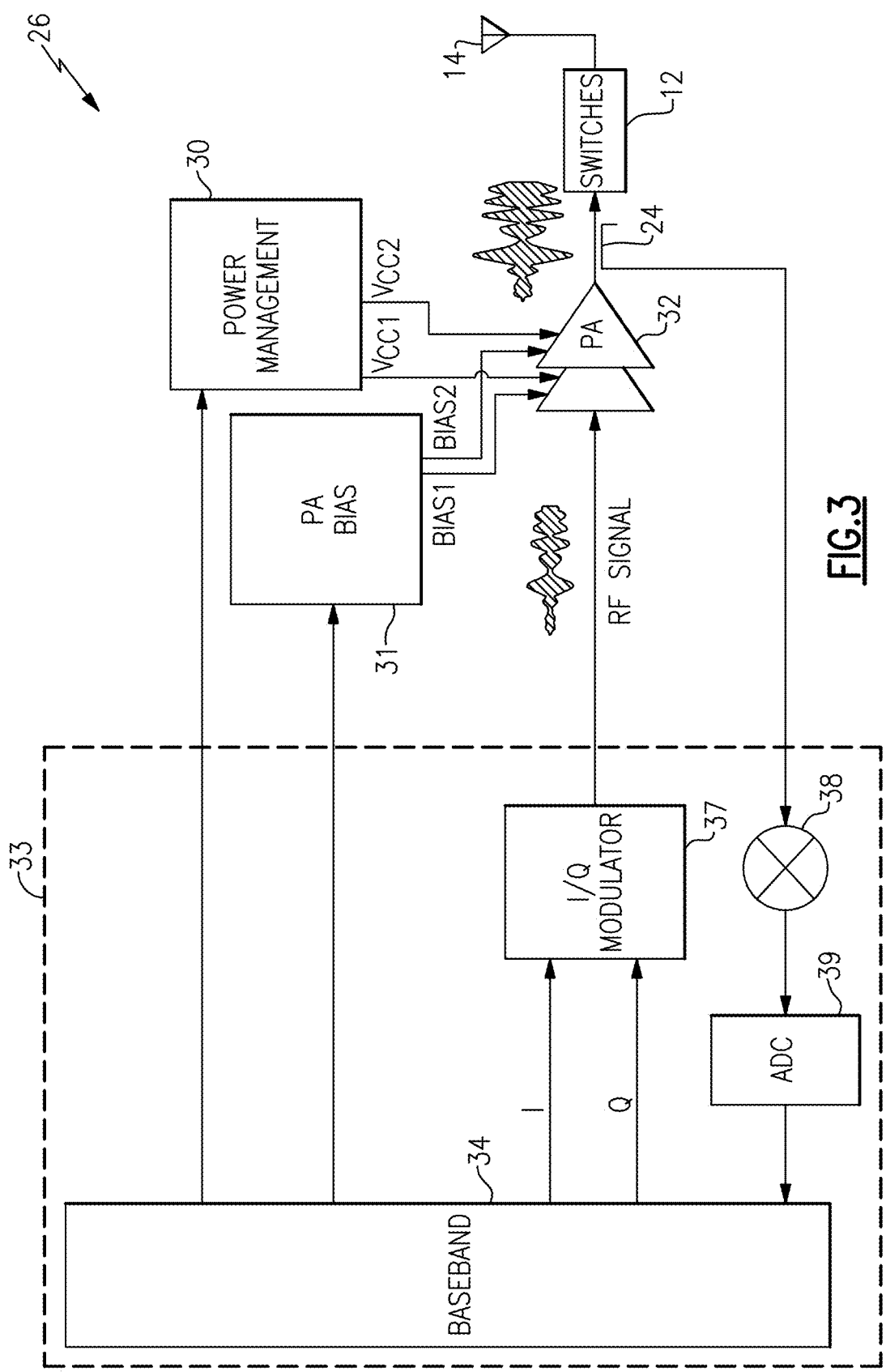
FIG. 3 is a schematic diagram of one embodiment of a power amplifier system.

FIG. 3 is a schematic block diagram of one example of a power amplifier system 26. The illustrated power amplifier system 26 includes the switches 12, the antenna 14, a directional coupler 24, a power management system 30, a power amplifier bias circuit 31, a power amplifier 32, and a transceiver 33. The illustrated transceiver 33 includes a baseband processor 34, an I/Q modulator 37, a mixer 38, and an analog-to-digital converter (ADC) 39. Although not illustrated in FIG. 3 for clarity, the transceiver 33 can include circuitry associated with receiving signals over one or more receive paths.

The baseband signal processor 34 can be used to generate an in-phase (I) signal and a quadrature-phase (Q) signal, which can be used to represent a sinusoidal wave or signal of a desired amplitude, frequency, and phase. For example, the I signal can be used to represent an in-phase component of the sinusoidal wave and the Q signal can be used to represent a quadrature-phase component of the sinusoidal wave, which can be an equivalent representation of the sinusoidal wave. In certain implementations, the I and Q signals can be provided to the I/Q modulator 37 in a digital format. The baseband processor 34 can be any suitable processor configured to process a baseband signal. For instance, the baseband processor 34 can include a digital signal processor, a microprocessor, a programmable core, or any combination thereof. Moreover, in some implementations, two or more baseband processors 34 can be included in the power amplifier system 26.

The I/Q modulator 37 can be configured to receive the I and Q signals from the baseband processor 34 and to process the I and Q signals to generate an RF signal. For example, the I/Q modulator 37 can include digital-to-analog converters (DACs) configured to convert the I and Q signals into an analog format, mixers for upconverting the I and Q signals to RF, and a signal combiner for combining the upconverted I and Q signals into an RF signal suitable for amplification by the power amplifier 32. In certain implementations, the I/Q modulator 37 can include one or more filters configured to filter frequency content of signals processed therein.

The power amplifier bias circuit 31 receives a bias control signal from the transceiver 33, and generates one or more bias signals for the power amplifier 32. In the illustrated configuration, the power amplifier bias circuit 31 generates a first bias signal BIAS1 for biasing a driver stage of the power amplifier 32 and a second bias signal BIAS2 for biasing an output stage of the power amplifier 32. The bias signals BIAS1, BIAS2 can include current and/or voltage signals, and can be used, for example, to bias bases of bipolar transistors and/or gates of field-effect transistors associated with the power amplifier's stages. In certain configurations, the transceiver 33 can control the bias signals generated by the power amplifier bias circuit 31 to enhance the PAE of the power amplifier system 26. In one embodiment, the transceiver 33 controls each of the first and second bias signals BIAS1, BIAS2 to one of a multiple settings based on at least one of a frequency band of operation or a power mode (for example, high power mode, medium power mode, or low power mode).

The power amplifier 32 can receive the RF signal from the I/Q modulator 37 of the transceiver 33, and when enabled can provide an amplified RF signal to the antenna 14 via the switches 12. The directional coupler 24 can be positioned between the output of the power amplifier 32 and the input of the switches 12, thereby allowing an output power measurement of the power amplifier 32 that does not include insertion loss of the switches 12. However, other configurations of power measurement are possible.

In the illustrated configuration, the sensed output signal from the directional coupler 24 is provided to the mixer 38, which multiplies the sensed output signal by a reference signal of a controlled frequency. The mixer 38 operates to generate a downshifted signal by downshifting the sensed output signal's frequency content. The downshifted signal can be provided to the ADC 39, which can convert the downshifted signal to a digital format suitable for processing by the baseband processor 34. By including a feedback path between the output of the power amplifier 32 and the baseband processor 34, the baseband processor 34 can be configured to dynamically adjust the I and Q signals to optimize the operation of the power amplifier system 26. For example, configuring the power amplifier system 26 in this manner can aid in controlling the PAE and/or linearity of the power amplifier 32. However, other configurations of power control can be used.

The power management system 30 receives a power control signal from the transceiver 33, and generates one or more power amplifier supply voltages for the power amplifier 32. In the illustrated configuration, the power management system 30 generates a first power amplifier supply voltage $V_{CC1}$ for powering a driver stage of the power amplifier 32 and a second power amplifier supply voltage $V_{CC2}$ for powering an output stage of the power amplifier 32. In certain configurations, the transceiver 33 can control the voltage levels of the power amplifier supply voltages $V_{CC1}$, $V_{CC2}$ to enhance the power amplifier system's PAE.

The power amplifier 32 can be implemented with any of the feedforward compensation schemes herein.

Figure 4:
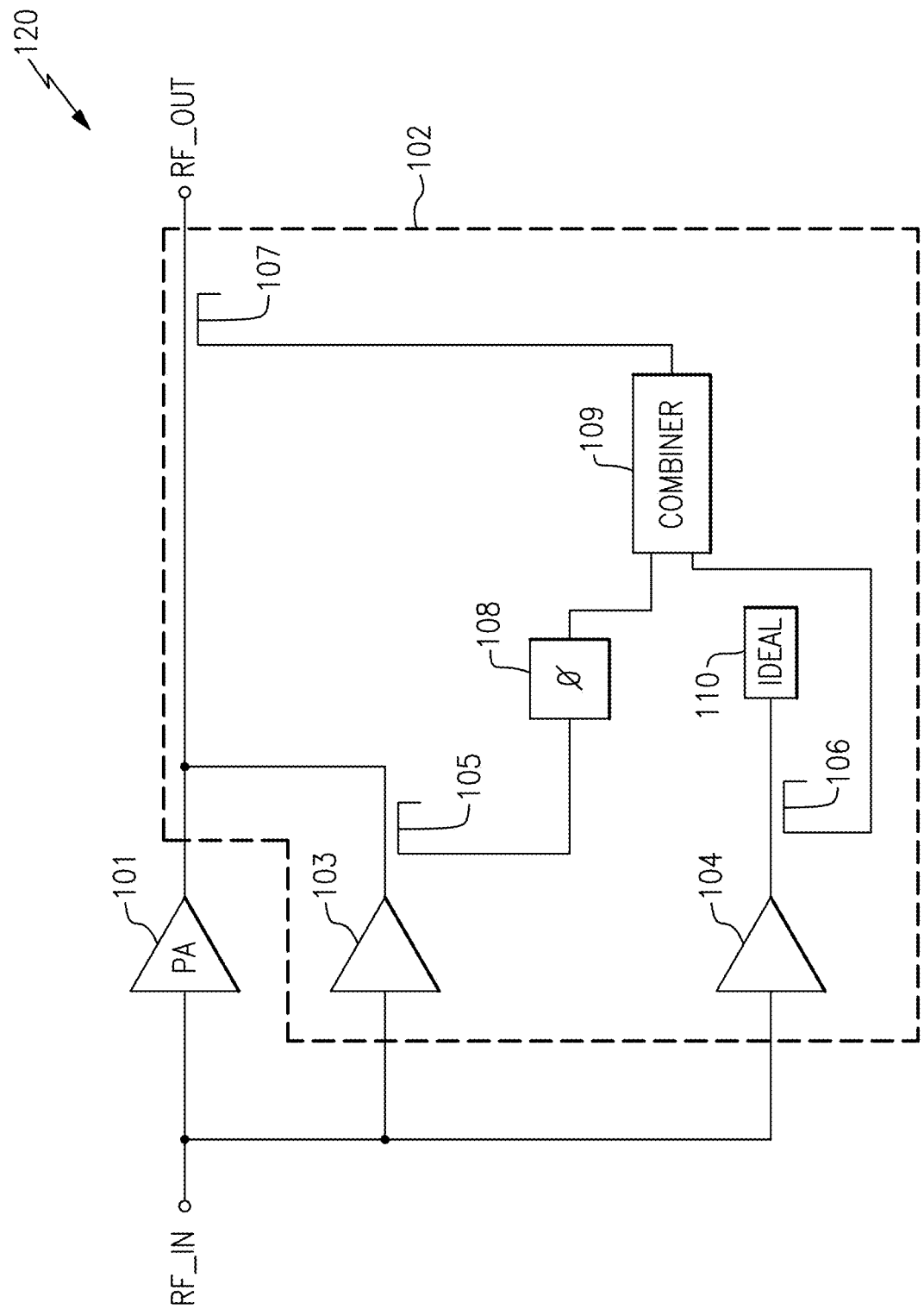
FIG. 4 is a schematic diagram of a broadband feedforward power amplifier according to one embodiment.

FIG. 4 is a schematic diagram of a broadband feedforward power amplifier 120 according to one embodiment. The broadband feedforward power amplifier 120 includes a power amplifier 101 and a feedforward compensation circuit 102 that compensates for a non-linearity of the power amplifier 101.

As shown in FIG. 4, the power amplifier 101 includes an input connected to an RF input RF_IN, and an output connected to an RF output RF_OUT. Absent compensation, the power amplifier 101 suffers from non-linearity, which can vary based on the load presented at the RF output RF_OUT. For example, the RF output RF_OUT can be connected to an antenna through switches, filters, and/or other circuitry, and can suffer from load variation, such as changing VSWR.

In the illustrated embodiment, the feedforward compensation circuit 102 includes a first amplifier 103, a second amplifier 104, a first directional coupler 105, a second directional coupler 106, a third directional coupler 107, a phase shifter 108, a combiner 109, and an ideal load impedance 110.

The first directional coupler 105 senses an output of the first amplifier 103 to generate a first sensed signal, while the second directional coupler 106 senses an output of the second amplifier 104 to generate a second sensed signal. The phase shifter 108 phase shifts the first sensed signal (for example, by about 180 degrees), and the combiner 109 combines the first sense signal after phase shifting with the second sensed signal. The combiner 109 injects a compensation signal into the RF output RF_OUT by way of the third directional coupler 107.

In certain implementations, the first amplifier 103 and the second amplifier 104 are replicas (which can be scaled) of the power amplifier 101. Thus, the first amplifier 103 and the second amplifier 104 can have matched gains, impedances, and other characteristics of the power amplifier 101.

With continuing reference to FIG. 4, the first amplifier 103 is connected in parallel with the power amplifier 101, and thus exhibits non-linearity that tracks that of the power amplifier 101. However, the second amplifier 104 is connected to the ideal load impedance 110, and thus operates with near ideal linear behavior.

Accordingly, the feedforward compensation circuit 102 detects the power amplifier's non-linearity based on a difference in signal level of a non-linear path through the first amplifier 103 and a linear path through the second amplifier 104. The difference is properly scaled and injected into the RF output RF_OUT such that non-linear components of the power amplifier 101 are cancelled.

In certain implementations, the first directional coupler 105 and the second directional coupler 106 each have a gain g, and the combiner 109 is implemented with a gain of about 2*g.

Figure 5A:
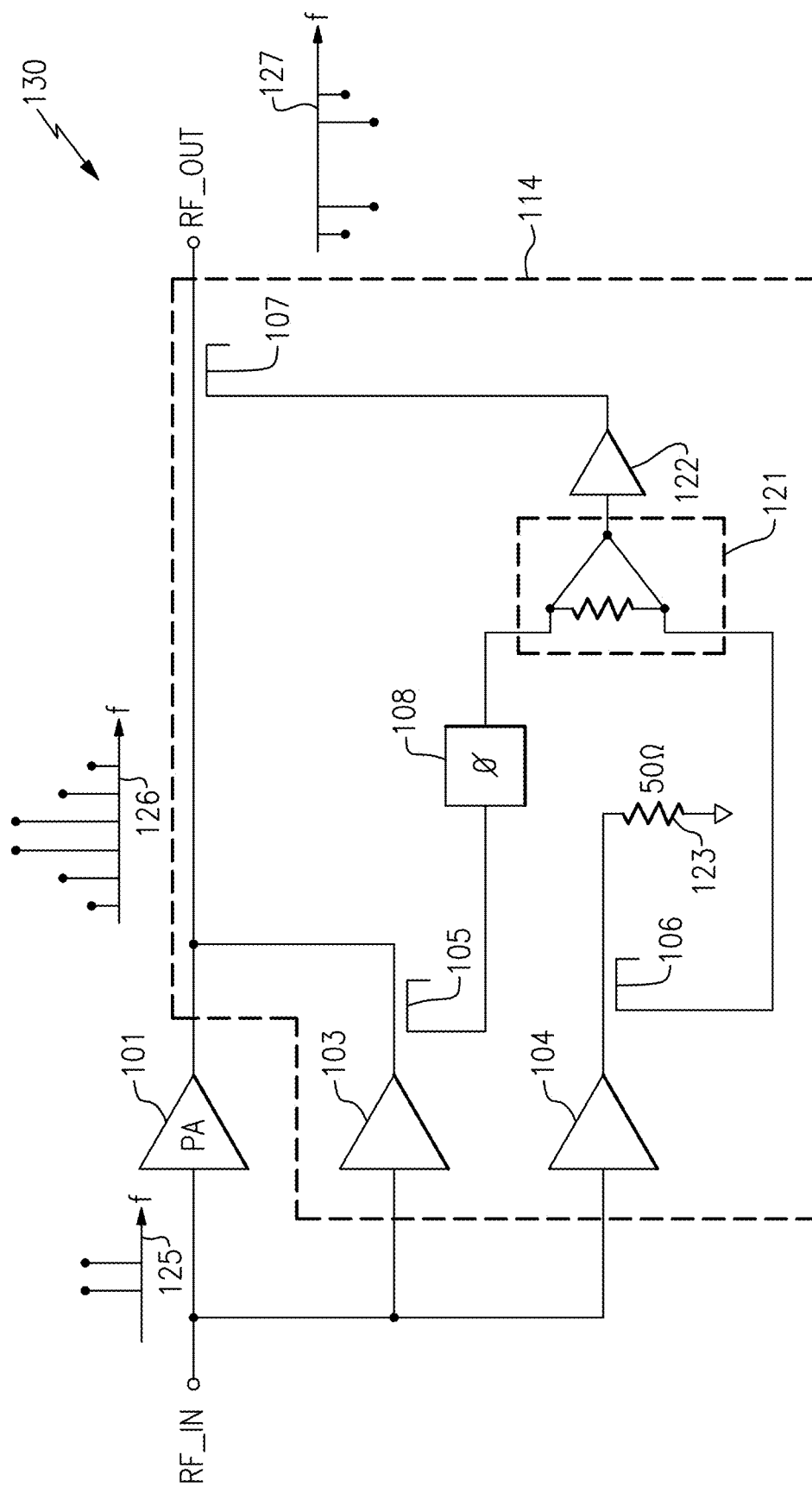
FIG. 5A is a schematic diagram of a broadband feedforward power amplifier according to another embodiment.

FIG. 5A is a schematic diagram of a broadband feedforward power amplifier 130 according to another embodiment. The broadband feedforward power amplifier 130 includes a power amplifier 101 and a feedforward compensation circuit 114. The feedforward compensation circuit 114 includes a first amplifier 103, a second amplifier 104, a first directional coupler 105, a second directional coupler 106, a third directional coupler 107, a phase shifter 108, a passive combiner 121, a third amplifier 122, and a fifty ohm resistor 123.

The broadband feedforward power amplifier 130 of FIG. 5A is similar to the broadband feedforward power amplifier 120 of FIG. 4, except that the broadband feedforward power amplifier 130 illustrates a specific implementation of a load impedance and of a combiner.

In particular, the broadband feedforward power amplifier 130 includes the fifty ohm resistor 123. Additionally, the broadband feedforward power amplifier 130 includes a cascade of the passive combiner 121 and the third amplifier 122.

In certain implementations, the amplifier 122 has a gain of about 2*g, where g is the coupling factor of the first directional coupler 105 and the second directional coupler 106.

As shown in FIG. 5A, the broadband feedforward power amplifier 130 has been annotated with various examples of power versus frequency plots at different circuit nodes.

In the example depicted in FIG. 5A, the power amplifier amplifies an RF input signal having an input spectrum 125 with desired signal components. After amplification by the power amplifier 101, an RF output signal having an output spectrum 126 is generated. The output spectrum 126 includes amplified signal components along with non-linear components, which can be in-band, out-of-band, or a combination thereof.

The feedforward compensation circuit 114 generates a compensation signal that is injected at the RF output terminal RF_OUT. The compensation signal includes an inverted version of the non-linear components.

Thus, when the compensation signal is combined with the RF output signal from the power amplifier 101, the non-linear components are canceled. Accordingly, the compensated RF output signal at the RF output RF_OUT has higher spectral purity relative to a power amplifier that operates without such compensation.

Figure 5B:
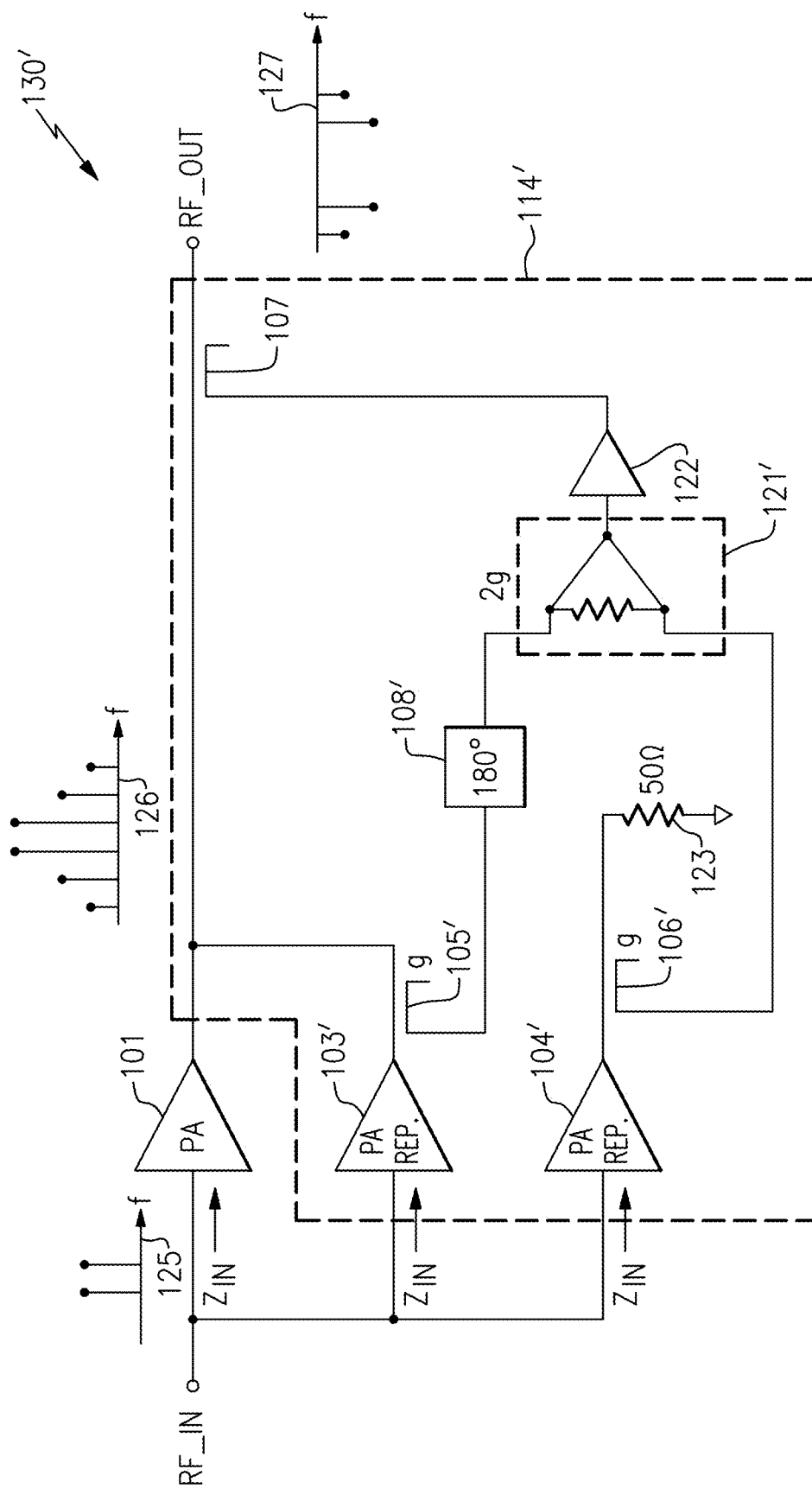
FIG. 5B is a schematic diagram of a broadband feedforward power amplifier according to another embodiment.

FIG. 5B is a schematic diagram of a broadband feedforward power amplifier 130' according to another embodiment. The broadband feedforward power amplifier 130' includes a power amplifier 101 and a feedforward compensation circuit 114'. The feedforward compensation circuit 114' includes a first amplifier 103', a second amplifier 104', a first directional coupler 105', a second directional coupler 106', a third directional coupler 107, a phase shifter 108', a passive combiner 121', a third amplifier 122, and a fifty ohm resistor 123.

The broadband feedforward power amplifier 130' of FIG. 5B is similar to the broadband feedforward power amplifier 130 of FIG. 5A, except that the first amplifier 103' and the second amplifier 104' are implemented as scaled replicas (or copies of reduced size having matched input impedance $Z_{IN}$) of the power amplifier 101. Additionally, in this embodiment, the phase shifter 108' provides 180 degrees phase shifter (or inversion), the first directional coupler 105' has gain g, the second directional coupler 106' is matched to the first directional coupler 105' and also has gain g, and the passive combiner 121' and third amplifier provide a gain of about twice g (2 g).

Figure 6:
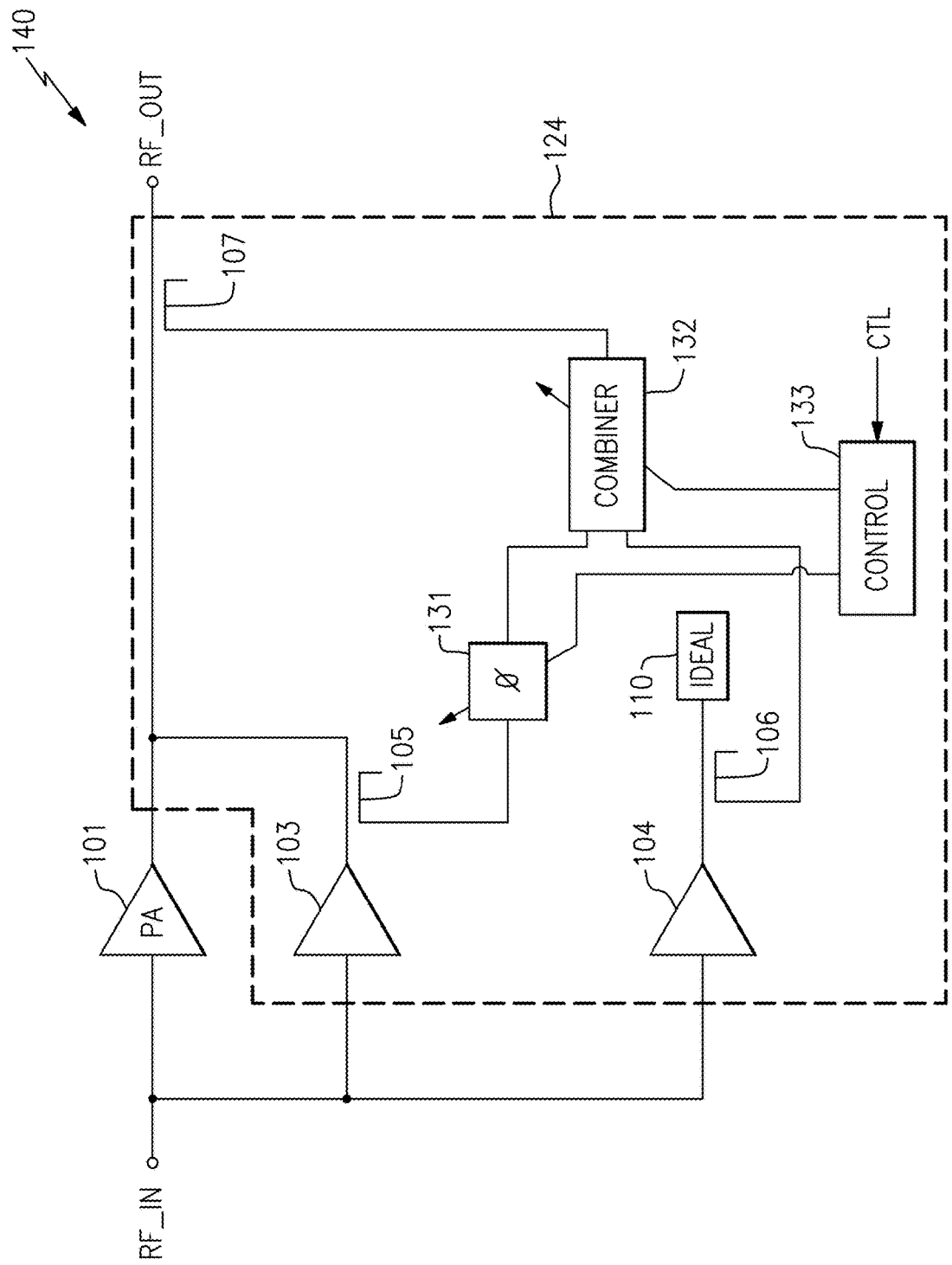
FIG. 6 is a schematic diagram of a broadband feedforward power amplifier according to another embodiment.

FIG. 6 is a schematic diagram of a broadband feedforward power amplifier 140 according to another embodiment. The broadband feedforward power amplifier 140 includes a power amplifier 101 and a feedforward compensation circuit 124. The feedforward compensation circuit 124 includes a first amplifier 103, a second amplifier 104, a first directional coupler 105, a second directional coupler 106, a third directional coupler 107, an ideal load impedance 110, a controllable phase shifter 131, a controllable combiner 132, and a control circuit 133.

The broadband feedforward power amplifier 140 of FIG. 6 is similar to the broadband feedforward power amplifier 130 of FIG. 5A, except that the broadband feedforward power amplifier 140 further includes circuitry for calibrating compensation.

In particular, the broadband feedforward power amplifier 140 includes the control circuit 133 that provides a phase adjustment to the controllable phase shifter 131 and a gain and/or phase adjustment to the controllable combiner 132. The control circuit 133 provides such adjustment based on a control signal CTL, which can be generated open loop or closed loop (for instance, based on observations at the RF output RF_OUT).

Any of the feedforward power amplifiers herein can be implemented with calibration.

Although one embodiment of calibration for a feedforward compensation circuit is depicted, the teachings herein are applicable to other implementations of calibration as well as to feedforward compensation circuits that operate without calibration.

Figure 7A:
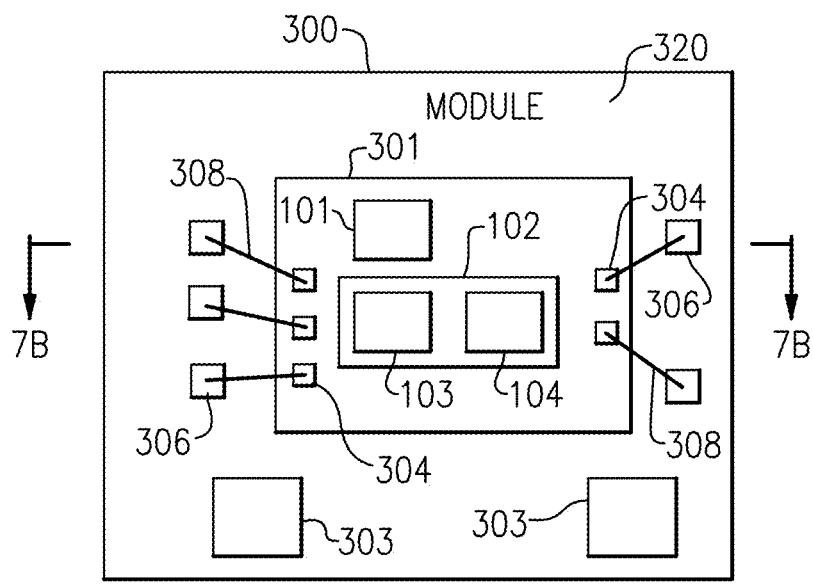
FIG. 7A is a schematic diagram of one embodiment of a packaged module.
Figure 7B:
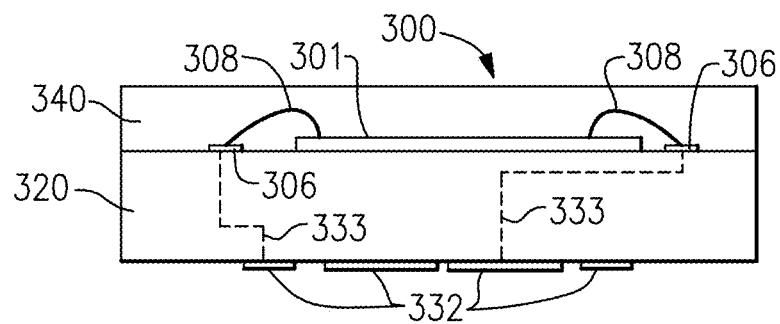
FIG. 7B is a schematic diagram of a cross-section of the packaged module of FIG. 7A taken along the lines 7B-7B.

FIG. 7A is a schematic diagram of one embodiment of a packaged module 300. FIG. 7B is a schematic diagram of a cross-section of the packaged module 300 of FIG. 7A taken along the lines 7B-7B.

The packaged module 300 includes an IC or die 301, surface mount components 303, wirebonds 308, a package substrate 320, and encapsulation structure 340. The package substrate 320 includes pads 306 formed from conductors disposed therein. Additionally, the die 301 includes pads 304, and the wirebonds 308 have been used to electrically connect the pads 304 of the die 301 to the pads 306 of the package substrate 301.

As illustrated in FIGS. 7A and 7B, the die 301 includes a power amplifier 101 and a feedforward compensation circuit 102, which includes the first amplifier 103 and the second amplifier 104. The feedforward compensation circuit 102 can including any combination of features of the present disclosure.

The packaging substrate 320 can be configured to receive a plurality of components such as the die 301 and the surface mount components 303, which can include, for example, surface mount capacitors and/or inductors.

As shown in FIG. 7B, the packaged module 300 is shown to include a plurality of contact pads 332 disposed on the side of the packaged module 300 opposite the side used to mount the die 301. Configuring the packaged module 300 in this manner can aid in connecting the packaged module 300 to a circuit board such as a phone board of a wireless device. The example contact pads 332 can be configured to provide RF signals, bias signals, power low voltage(s) and/or power high voltage(s) to the die 301 and/or the surface mount components 303. As shown in FIG. 7B, the electrically connections between the contact pads 332 and the die 301 can be facilitated by connections 333 through the package substrate 320. The connections 333 can represent electrical paths formed through the package substrate 320, such as connections associated with vias and conductors of a multilayer laminated package substrate.

In some embodiments, the packaged module 300 can also include one or more packaging structures to, for example, provide protection and/or facilitate handling of the packaged module 300. Such a packaging structure can include overmold or encapsulation structure 340 formed over the packaging substrate 320 and the components and die(s) disposed thereon.

It will be understood that although the packaged module 300 is described in the context of electrical connections based on wirebonds, one or more features of the present disclosure can also be implemented in other packaging configurations, including, for example, flip-chip configurations.

Applications

Some of the embodiments described above have provided examples in connection with wireless devices or mobile phones. However, the principles and advantages of the embodiments can be used for any other systems or apparatus that have needs for power amplifiers.

Such power amplifiers can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Conclusion

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A broadband feedforward power amplifier comprising:
a power amplifier electrically connected between a radio frequency input and a radio frequency output; and
a feedforward compensation circuit including a first amplifier electrically connected in parallel with the power amplifier, a load impedance, and a second amplifier electrically connected between the radio frequency input and the load impedance, the feedforward compensation circuit configured to generate a compensation signal based on sensing an output of the first amplifier and an output of the second amplifier, and to provide the compensation signal to the radio frequency output.

2. The broadband feedforward power amplifier of claim 1 wherein the first amplifier and the second amplifier are each a scaled replica of the power amplifier.

3. The broadband feedforward power amplifier of claim 2 wherein the power amplifier, the first amplifier, and the second amplifier have matched input impedances.

4. The broadband feedforward power amplifier of claim 1 wherein the output of the first amplifier is configured to provide a non-linear signal and the output of the second amplifier is configured to provide a linear signal.

5. The broadband feedforward power amplifier of claim 1 wherein the feedforward compensation circuit further includes a first directional coupler configured to generate a first coupled signal based on sensing the output of the first amplifier, and a second directional coupler configured to generate a second coupled signal based on sensing the output of the second amplifier.

6. The broadband feedforward power amplifier of claim 5 wherein the feedforward compensation circuit further includes a phase shifter configured to generate a phase shifted signal, and a combiner configured to combine the phase shifted signal and the second coupled signal.

7. The broadband feedforward power amplifier of claim 5 wherein the feedforward compensation circuit further includes a third amplifier configured to amplify the compensation signal to account for a coupling factor of the first directional coupler and the second directional coupler.

8. The broadband feedforward power amplifier of claim 5 wherein the feedforward compensation circuit further includes a third directional coupler configured to inject the compensation signal at the radio frequency output.

9. The broadband feedforward power amplifier of claim 1 wherein the load impedance is a resistor.

10. The broadband feedforward power amplifier of claim 1 wherein the feedforward compensation is implemented with calibration.

11. A mobile phone comprising:
a transceiver configured to generate a radio frequency transmit signal; and
a front end system including a power amplifier configured to receive the radio frequency transmit signal at a radio frequency input and to provide an amplified radio frequency transmit signal at a radio frequency output, and a feedforward compensation circuit including a first amplifier electrically connected in parallel with the power amplifier, a load impedance, and a second amplifier electrically connected between the radio frequency input and the load impedance, the feedforward compensation circuit configured to generate a compensation signal based on sensing an output of the first amplifier and an output of the second amplifier, and to provide the compensation signal to the radio frequency output.

12. The mobile phone of claim 11 wherein the first amplifier and the second amplifier are each a scaled replica of the power amplifier.

13. The mobile phone of claim 12 wherein the power amplifier, the first amplifier, and the second amplifier have matched input impedances.

14. The mobile phone of claim 11 wherein the feedforward compensation circuit further includes a first directional coupler configured to generate a first coupled signal based on sensing the output of the first amplifier, and a second directional coupler configured to generate a second coupled signal based on sensing the output of the second amplifier.

15. The mobile phone of claim 14 wherein the feedforward compensation circuit further includes a phase shifter configured to generate a phase shifted signal, and a combiner configured to combine the phase shifted signal and the second coupled signal.

16. The mobile phone of claim 14 wherein the feedforward compensation circuit further includes a third amplifier configured to amplify the compensation signal to account for a coupling factor of the first directional coupler and the second directional coupler.

17. The mobile phone of claim 14 wherein the feedforward compensation circuit further includes a third directional coupler configured to inject the compensation signal at the radio frequency output.

18. A method of power amplifier compensation, the method comprising:
  amplifying a radio frequency transmit signal using a power amplifier that is electrically connected between a radio frequency input and a radio frequency output;
  amplifying the radio frequency transmit signal using a first amplifier electrically connected in parallel with the power amplifier;
  amplifying the radio frequency transmit signal using a second amplifier electrically connected between the radio frequency input and a load impedance; and
  compensating the power amplifier for non-linearity using a compensation signal generated based on sensing an output of the first amplifier and an output of the second amplifier.

19. The method of claim 18 further comprising generating a first coupled signal based on sensing the output of the first amplifier using a first directional coupler, and generating a second coupled signal based on sensing the output of the second amplifier using a second directional coupler.

20. The method of claim 19 further comprising generating a phase shifted signal by phase shifting the first coupled signal, and combining the phase shifted signal and the second coupled signal to generate a combined signal.

* * * * *